(12) United States Patent
Alakarhu et al.

(10) Patent No.: US 9,398,279 B2
(45) Date of Patent: Jul. 19, 2016

(54) IMAGE SENSOR OPTIMIZATION

(75) Inventors: Juha Alakarhu, Helsinki (FI); Eero Salmelin, Tampere (FI)

(73) Assignee: Nokia Technologies Oy, Espoo (FI)

( * ) Notice: Subject to any disclaimer, the term of this patent is extended or adjusted under 35 U.S.C. 154(b) by 499 days.

(21) Appl. No.: 13/637,900

(22) PCT Filed: Mar. 29, 2010

(86) PCT No.: PCT/FI2010/050243
§ 371 (c)(1),
(2), (4) Date: Nov. 29, 2012

(87) PCT Pub. No.: WO2011/121165
PCT Pub. Date: Oct. 6, 2011

(65) Prior Publication Data
US 2013/0070130 A1    Mar. 21, 2013

(51) Int. Cl.
| H04N 5/235 | (2006.01) |
| H04N 5/238 | (2006.01) |
| H04N 5/335 | (2011.01) |
| H04N 9/64 | (2006.01) |
| H01L 27/146 | (2006.01) |
| H04N 5/355 | (2011.01) |
| H04N 5/357 | (2011.01) |

(52) U.S. Cl.
CPC .......... H04N 9/643 (2013.01); H01L 27/14605 (2013.01); H04N 5/355 (2013.01); H04N 5/3572 (2013.01)

(58) Field of Classification Search
CPC ... H04N 5/235; H04N 5/2351; H04N 5/2352; H04N 5/2353

USPC ............ 348/362–364, 302, 222.1, 221.1, 348/231.99, 341, 308, 307, 310, 366; 257/292

See application file for complete search history.

(56) References Cited

U.S. PATENT DOCUMENTS

| 6,642,496 | B1 | 11/2003 | Gulbransen | |
| 2004/0079977 | A1* | 4/2004 | Ying | H04N 5/3559 257/292 |
| 2004/0125226 | A1 | 7/2004 | Kubo | |
| 2004/0189837 | A1* | 9/2004 | Kido | H04N 5/243 348/241 |

(Continued)

FOREIGN PATENT DOCUMENTS

| EP | 1447977 | 8/2004 |
| EP | 1564681 | 8/2005 |

(Continued)

OTHER PUBLICATIONS

International Search Report for International Application No. PCT/FI2010/050243—Date of Completion of Search: Dec. 9, 2010—4 pages.

(Continued)

*Primary Examiner* — Sinh Tran
*Assistant Examiner* — Xi Wang
(74) *Attorney, Agent, or Firm* — Locke Lord LLP

(57) ABSTRACT

An apparatus including: a plurality of photodetectors for converting the light to which they are exposed to into signals for image generation, wherein the photodetectors use locally optimized saturation signal. The apparatus is, for example, an image sensor or an electronic communication device.

15 Claims, 3 Drawing Sheets

(56) References Cited

U.S. PATENT DOCUMENTS

| | | |
|---|---|---|
| 2005/0030383 A1 | 2/2005 | Li |
| 2006/0146159 A1* | 7/2006 | Farrier ............... H01L 27/14603 348/308 |
| 2007/0252073 A1 | 11/2007 | Yang et al. |
| 2008/0211945 A1 | 9/2008 | Hong et al. |
| 2008/0284879 A1 | 11/2008 | Hu |
| 2009/0021632 A1 | 1/2009 | Huggett |
| 2009/0303362 A1* | 12/2009 | Ebihara ................. H04N 5/353 348/296 |
| 2011/0043674 A1* | 2/2011 | Takane ............... H04N 58/2351 348/296 |
| 2011/0310278 A1* | 12/2011 | Bai .................... H04N 5/35554 348/294 |

FOREIGN PATENT DOCUMENTS

| | | |
|---|---|---|
| EP | 1881452 | 1/2008 |
| FR | 2687265 | 8/1993 |

OTHER PUBLICATIONS

Written Opinion of the International Searching Authority for International Application No. PCT/FI2010/050243—Date of Completion of Opinion: Dec. 9, 2010—7 pages.

Goldman, D. B. et al., "Vignette and Exposure Calibration and Compensation", <http://grail.cs.washington.edu/projects/vignette/vign.iccv05.pdf>, 8 pages.

* cited by examiner

IMAGE SENSOR OPTIMIZATION

TECHNICAL FIELD

The present invention generally relates to digital photography and image sensor optimization and more particularly, but not exclusively to full well capacity optimization.

BACKGROUND ART

In the field of digital photography the term full well capacity can be defined as the maximum signal or number of electrons that each pixel can hold before saturating. This has an effect on dynamic range of image sensor.

One of the decisions that has to be made when designing an image sensor is the trade off between full well capacity, performance in low light conditions (conversion gain: how high signal voltage each electron generates) and density of defect pixels. The higher voltage is applied to a pixel, the higher full well capacity can be achieved. However, higher voltage may increase the defect density of the pixels.

SUMMARY

According to a first example aspect of the invention there is provided an apparatus comprising:
a plurality of photodetectors configured to convert the light to which they are exposed to into signals for image generation, wherein
the photodetectors are configured to use locally optimized saturation signal.

According to a second example aspect of the invention there is provided a method comprising:
exposing photodetectors of an image sensor to light for obtaining image data, and using locally optimized saturation signal in the photodetectors.

According to a third example aspect of the invention there is provided an apparatus comprising:
at least one processor; and
at least one memory including computer program code;
the at least one memory and the computer program code configured to, with the at least one processor, cause the apparatus to perform:
controlling an image sensor comprising photodetectors, determining current image capturing condition, and
controlling the photodetectors of the image sensor to change between locally optimized saturation signal and globally optimized saturation signal based on determined image capturing condition.

According to a fourth example aspect of the invention there is provided a method comprising:
controlling an image sensor comprising photodetectors, determining current image capturing condition, and
controlling the photodetectors of the image sensor to change between locally optimized saturation signal and globally optimized saturation signal based on determined image capturing condition.

According to a fifth example aspect of the invention there is provided a computer program embodied on a computer readable medium comprising computer executable program code which, when executed by at least one processor of an apparatus, causes the apparatus to perform:
controlling an image sensor comprising photodetectors, determining current image capturing condition, and
controlling the photodetectors of the image sensor to change between locally optimized saturation signal and globally optimized saturation signal based on determined image capturing condition.

According to yet another example aspect of the invention there is provided a memory medium carrying the computer program of the fifth example aspect.

Different non-binding example aspects of the present invention have been illustrated in the foregoing.

BRIEF DESCRIPTION OF THE DRAWINGS

The invention will be described, by way of example only, with reference to the accompanying drawings, in which.

DETAILED DESCRIPTION

Reference in the specification to "one embodiment" or "an embodiment" or "an example embodiment" means that a particular feature, structure, or characteristic described in connection with the embodiment is included in at least one embodiment of the invention. The appearances of the phrase "in an embodiment" in various places in the specification are not necessarily all referring to the same embodiment, nor are separate or alternative embodiments mutually exclusive of other embodiments.

In an example embodiment, photogate based pixels are employed. The photogates allow each pixel of an image sensor to be driven with their own driving voltage. This allows pixel-wise optimization of saturation signal and full well capacity, for example. It must be noted that photogates are just one example and other embodiments may use some other type of photodetectors or light detecting elements.

In an example embodiment image sensor pixel parameters are optimized over the image sensor plane.

In an example embodiment sensor full well capacity/saturation signal is optimized over the image plane/image sensor area so that it corresponds to typical camera behaviour where the system relative illumination gradually drops from the image center towards the corners of the image plane.

Figure 1A:
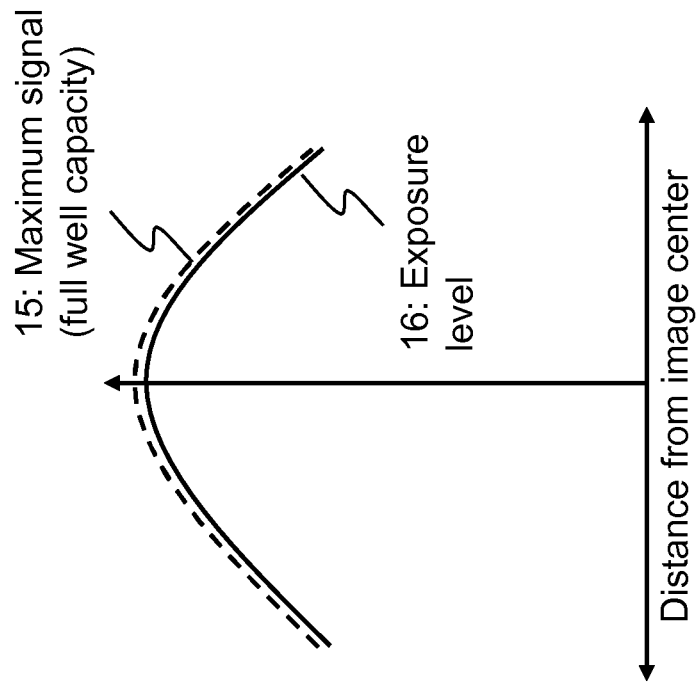
FIG. 1A illustrates an example of global saturation signal optimization according to an example embodiment.

FIG. 1A illustrates an example of global saturation signal optimization according to an example embodiment. Dashed line 11 shows maximum signal (full well capacity) as a function of distance from image center and solid line 12 shows exposure level as a function of distance from image center. In this case the maximum signal is constant over the image plane. Due to optical and sensor relative illumination (shading, vignetting) the exposure level 12 decreases towards corners of the image plane. The main optical reasons for decreasing relative illumination are optical cosine law and vignetting. The main sensor-related reason is the fact that the sensor response decreases when light rays arrive at the sensor surface in a higher angle.

Figure 1B:
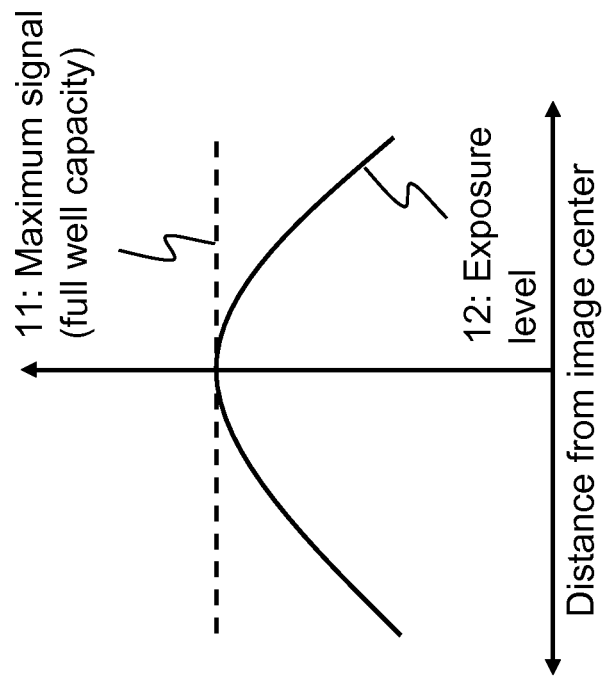
FIG. 1B illustrates an example of local saturation signal optimization according to an example embodiment.

FIG. 1B illustrates an example of local saturation signal optimization according to an example embodiment. Dashed line 15 shows maximum signal (full well capacity) as a function of distance from image center and solid line 16 shows exposure level as a function of distance from image center. In this case the maximum signal is optimized separately for different parts of the image plane so that the maximum signal is higher at the image center than in corners (i.e. when distance from the image center increases). The center and corner areas of the sensor saturate at the exposure when using the sensor with a practical lens. In this way, higher exposure level can be achieved over the image plane when compared to the example in FIG. 1A. Additionally noisy image corners caused by poor relative illumination may be avoided or at least reduced.

Figure 2:
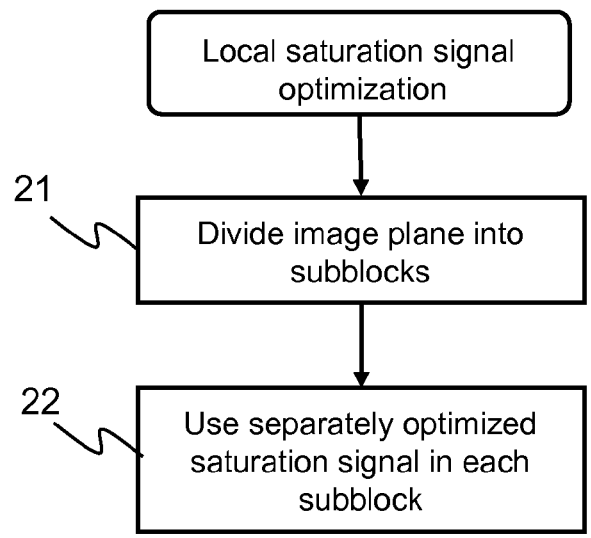
FIG. 2 shows a flow chart according to an example embodiment.

FIG. 2 shows a flow chart illustrating local saturation signal optimization according to an example embodiment.

In phase 21, image plane is divided into a plurality of subblocks or areas. In an example embodiment a subblock comprises one pixel. Alternative a subblock may comprise more than one pixel, e.g. four pixels. In phase 23, saturation signal optimization is performed separately for each subblock or area such that saturation signal in different areas is independent from saturation signal in other areas. In an example embodiment the locally optimized saturation signal is such that saturation signal in a center part of the image plane is higher than saturation signal in corners areas of the image plane.

Figure 3A:
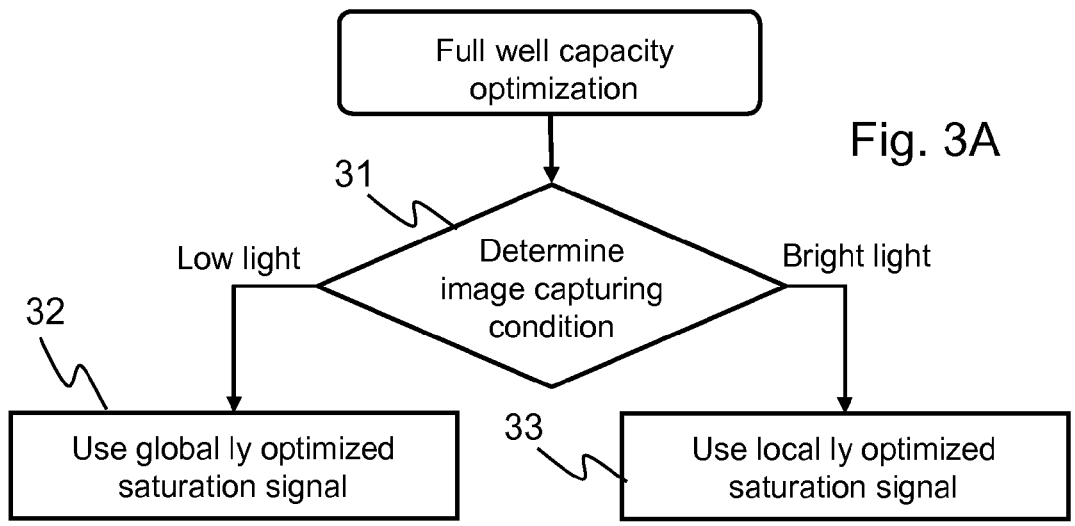
FIG. 3A shows a flow chart according to an example embodiment.

In an example embodiment, the system switches between global and local saturation signal optimization depending on current image capturing conditions. The image capturing condition may be illumination condition or exposure condition, for example. FIG. 3A shows a flow chart according to such example embodiment. In phase 31 image capturing condition is determined. In an example embodiment determination of the image capturing condition is done so that all cases which do not need gain are considered have "bright light illumination condition" and all other cases are considered have "low light illumination condition". Also other methods or criteria may be used. In low light condition, globally optimized saturation signal is used in phase 32. In bright light condition, locally optimized saturation signal is used in phase 33. E.g. when going from bright light to low light, the system switches from global saturation signal optimization to local saturation signal optimization and vice versa. The local and global saturation signals may be for example similar to the ones illustrated in FIGS. 1A and 1B. It is to be noted that this is just an example and other alternatives may exist.

Figure 3B:
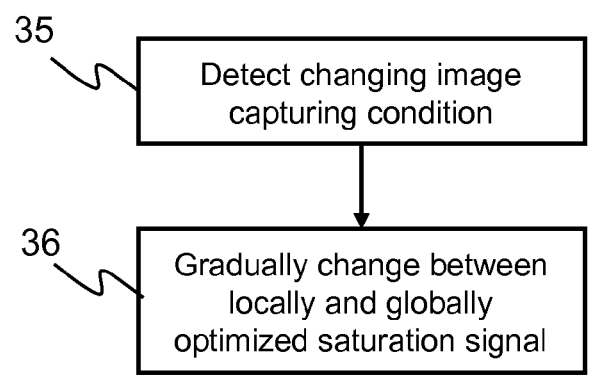
FIG. 3B shows a flow chart according to an example embodiment.

An alternative system may gradually switch between the modes, i.e. the system may gradually switch from global to local saturation signal optimization and vice versa. FIG. 3B shows a flow chart according to such example embodiment. In phase 35, changing image capturing condition is detected, and in phase 36, the system changes gradually between locally and globally optimized saturation signal.

An advantage obtained by local saturation signal optimization is that signal-to-noise ratio can be improved in image corners instead of correcting only brightness. In this way better image quality and better trade-off between dark current and full well capacity may be obtained. Additionally as saturation signal is optimized locally, the exposure level over the image plane (or sensor size) can be optimized for both saturation signal and for vignetting/shading reduction.

Defect pixels are usually a problem only in low light conditions. In bright light, pixel signal level is so high that defect pixels are not visible or they can be easily corrected. In bright light it is also possible to use longer exposure time without causing images that are blurred due to handshake. When the illumination is low enough the exposure time achieves its maximum (limited by the handshake) and it is not possible to increase it any more. Therefore the local saturation signal optimization is well suited for bright light conditions, whereas global saturation signal may suit better for low light conditions. This is taken into account in the embodiment comprising switching between locally and globally optimized saturation signals depending on the illumination conditions.

At least some features of the present invention may be implemented in software, hardware, application logic or a combination of software, hardware and/or application logic. The software, application logic and/or hardware may reside on any suitable imaging apparatus, such as a camera, or a mobile phone or a portable computing device having imaging capabilities.

In an example embodiment, the application logic, software or an instruction set is maintained on any one of various conventional computer-readable media. In the context of this document, a "computer-readable medium" may be any media or means that can contain, store, communicate, propagate or transport the instructions for use by or in connection with an instruction execution system, apparatus, or device, such as a camera or other imaging apparatus, with one example of an imaging apparatus described and depicted in FIG. 7 below. The computer-readable medium may be a digital data storage such as a data disc or diskette, optical storage, magnetic storage, holographic storage, phase-change storage (PCM) or opto-magnetic storage. The computer-readable medium may be formed into a device without other substantial functions than storing memory or it may be formed as part of a device with other functions, including but not limited to a memory of a computer, a chip set, and a sub assembly of an electronic device.

Figure 4:
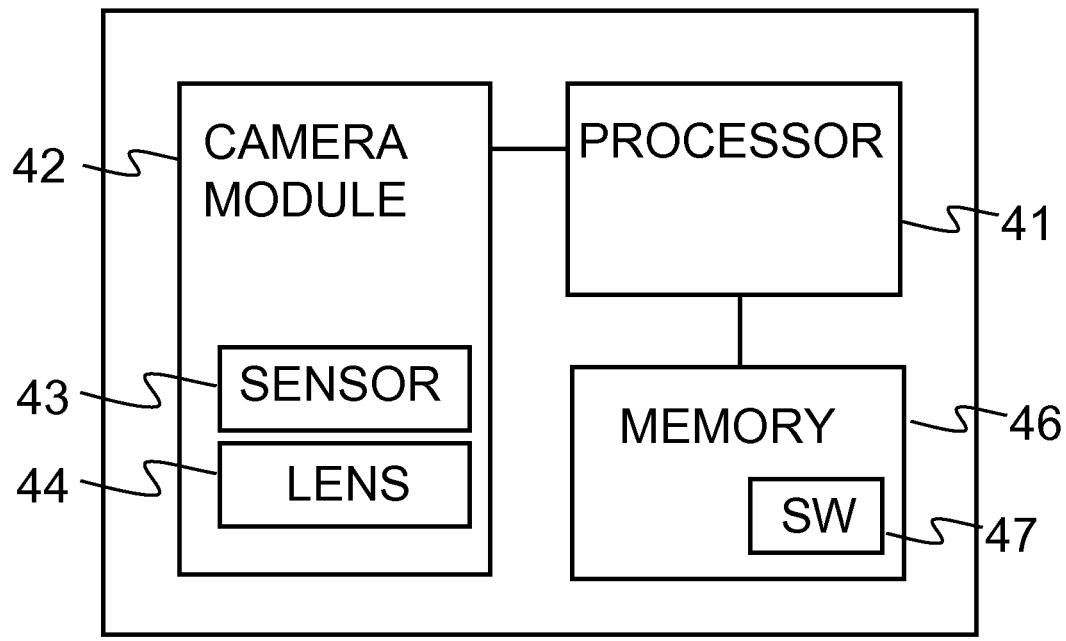
FIG. 4 shows a block diagram of an apparatus according to an example embodiment.

FIG. 4 shows a block diagram of an apparatus 40 according to an example embodiment. The apparatus may be for example a camera, a mobile phone, an electronic communication device, or a portable computing device having imaging capabilities.

The apparatus 40 a physically tangible object and comprises a camera module 42, and at least one memory 46 configured to store computer program code (or software) 47. The apparatus 40 further comprises at least one processor 41 for controlling at least some part of the operation of the apparatus 40 using the computer program code 47.

The camera module 42 comprises a camera lens 44 and an image sensor 43. The camera module 42 is configured to capture images using the lens 44 and the sensor 43. The sensor comprises a plurality of photodetectors, such as photogates, that are configured to convert the light to which they are exposed to into signals for image generation.

The at least one processor 41 may be a master control unit (MCU). Alternatively, the at least one processor 41 may be a microprocessor, a digital signal processor (DSP), an application specific integrated circuit (ASIC), a field programmable gate array, a microcontroller or a combination of such elements. FIG. 4 shows one processor 41, but the apparatus 40 may comprise a plurality of processors 41. The at least one memory 46 may be, for example, random access memory, flash memory, hard disk, hard disk array, optical storage, memory stick, memory card and/or magnetic memory.

A skilled person appreciates that in addition to the elements shown in FIG. 4, the apparatus 40 may comprise other elements, such as user interfaces, displays, as well as communication units, and other additional circuitry such as input/output (I/O) circuitry, memory chips, and the like. Additionally, the apparatus 40 may comprise a disposable or rechargeable battery (not shown) for powering the apparatus 40. A communication unit included in the apparatus may be for example a radio interface module, such as a WLAN, Bluetooth, GSM/GPRS, CDMA, WCDMA, or LTE radio module. Such communication unit may be integrated into the apparatus 40 or into an adapter, card or the like that may be inserted into a suitable slot or port of the apparatus 40. The communication unit may support one radio interface technology or a plurality of technologies and there may be one or more such communication units.

As to the operations of at least some example embodiments of the invention, when the computer program code 47 is executed by the at least one processor 41, this causes the apparatus 40 to implement controlling of saturation signal/full well capacity of the image sensor 43.

Figure 5:
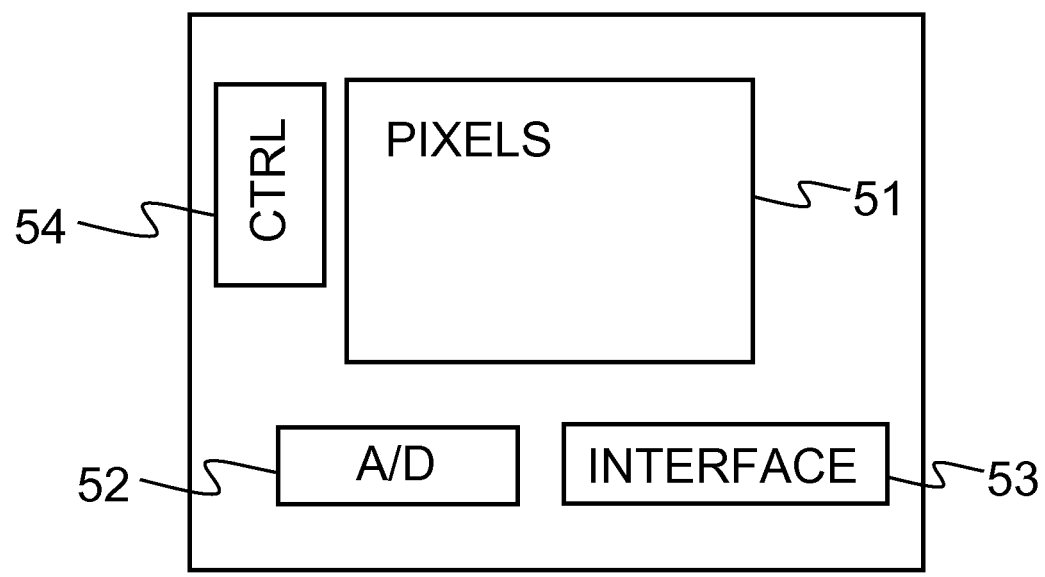
FIG. 5 shows a block diagram of a sensor according to an example embodiment.

FIG. 5 shows a block diagram of an image sensor 50 according to an example embodiment. It is to be noted that this is just an example of a sensor in which embodiments of the invention may be employed and that also some other kind of a sensor may apply.

The sensor 50 comprises pixel/sensitive area 51 which comprises light detecting elements, such as photogates, configured to capture the light rays that arrive at the sensor. Additionally the sensor 50 comprises an analog-to-digital converter 52, interface 53 to external components, and a control unit 54. The analog-to-digital converter 52 is configured to convert captured light signals into digital form. The interface 53 is configured to output captured image data, for example. The interface may be used for receiving instructions or control signals from external components, too. The control unit 54 is configured to control operation of the sensor and may be configured to provide functionality according to various embodiments of the invention. Additionally the control unit 54 may be configured to provide other functionality.

Various embodiments have been presented. It should be appreciated that in this document, words comprise, include and contain are each used as open-ended expressions with no intended exclusivity.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means or in different combinations of embodiments without deviating from the characteristics of the invention. It is also noted that the above embodiments are used merely to explain selected aspects or steps that may be utilized in implementations of the present invention. Some features may be presented only with reference to certain example embodiments of the invention. It should be appreciated that corresponding features may apply to other embodiments as well.

Furthermore, some of the features of the above-disclosed embodiments of this invention may be used to advantage without the corresponding use of other features. As such, the foregoing description shall be considered as merely illustrative of the principles of the present invention, and not in limitation thereof. Hence, the scope of the invention is only restricted by the appended patent claims.

We claim:

1. An apparatus comprising:
   a plurality of photodetectors configured to convert the light to which they are exposed to into signals for image generation, wherein the photodetectors form an image plane divided into two or more areas, and wherein the photodetectors are configured to use locally optimized saturation signal, wherein the locally optimized saturation signal is such that saturation signal of photodetectors in different areas is independent from saturation signal in other areas, and wherein the apparatus comprises a processor configured
   to determine current image capturing condition, and
   to control the photodetectors to change between locally optimized saturation signal and globally optimized saturation signal based on determined image capturing condition, wherein the globally optimized saturation signal is such that the photodetectors use the same saturation signal.

2. The apparatus of claim 1, wherein the two or more areas each comprise one pixel.

3. The apparatus of claim 1, wherein the photodetectors form an image plane having a center part and corner areas, and wherein the locally optimized saturation signal is such that photodetectors in the center part use higher saturation signal than photodetectors in the corners areas.

4. The apparatus of claim 1, wherein the photodetectors are configured to use locally optimized saturation signal in bright light conditions and globally optimized saturation signal in low light conditions.

5. The apparatus of claim 1, further comprising:
   a processor configured to control the photodetectors to use locally optimized saturation signal.

6. The apparatus of claim 1, wherein the image capturing condition is illumination condition or exposure condition.

7. The apparatus of claim 1, wherein the processor is configured
   to control the photodetectors to gradually change between locally optimized saturation signal and globally optimized saturation signal.

8. The apparatus of claim 1, wherein the apparatus is an electronic communication device.

9. A method comprising:
   exposing photodetectors of an image sensor to light for obtaining image data, wherein the photodetectors form an image plane divided into two or more areas,
   using locally optimized saturation signal in the photodetectors, wherein the locally optimized saturation signal is such that saturation signal of photodetectors in different areas is independent from saturation signal in other areas,
   determining current image capturing condition, and
   controlling the photodetectors to change between locally optimized saturation signal and globally optimized saturation signal based on determined image capturing condition, wherein the globally optimized saturation signal is such that the photodetectors use the same saturation signal.

10. The method of claim 9, wherein the photodetectors form an image plane having a center part and corner areas, and wherein the locally optimized saturation signal is such that photodetectors in the center part use higher saturation signal than photodetectors in the corners areas.

11. The method of claim 9, further comprising using locally optimized saturation signal in the photodetectors in bright light conditions and using globally optimized saturation signal in the photodetectors in low light conditions.

12. An apparatus comprising:
   at least one processor; and
   at least one memory including computer program code;
   the at least one memory and the computer program code configured to, with the at least one processor, cause the apparatus to perform:
   controlling an image sensor comprising photodetectors, wherein the photodetectors form an image plane divided into two or more areas, determining current image capturing condition, and controlling the photodetectors of the image sensor to change between locally optimized saturation signal and globally optimized saturation signal based on determined image capturing condition, wherein the locally optimized saturation signal is such that saturation signal of photodetectors in different areas is independent from saturation signal in other areas, and wherein the globally optimized saturation signal is such that the photodetectors use the same saturation signal.

13. The apparatus of claim 12, wherein the at least one memory and the computer program code are further configured to, with the at least one processor, cause the apparatus to perform:

controlling the photodetectors to gradually change between locally optimized saturation signal and globally optimized saturation signal.

14. A method comprising:
controlling an image sensor comprising photodetectors, wherein the photodetectors form an image plane divided into two or more areas, determining current image capturing condition, and controlling the photodetectors of the image sensor to change between locally optimized saturation signal and globally optimized saturation signal based on determined image capturing condition, wherein the locally optimized saturation signal is such that saturation signal of photodetectors in different areas is independent from saturation signal in other areas, and wherein the globally optimized saturation signal is such that the photodetectors use the same saturation signal.

15. The method of claim 14, further comprising controlling the photodetectors to gradually change between locally optimized saturation signal and globally optimized saturation signal.

* * * * *